(12) United States Patent
Zhu

(10) Patent No.: US 8,598,634 B1
(45) Date of Patent: Dec. 3, 2013

(54) GRAPHENE-BASED EFUSE DEVICE

(75) Inventor: Wenjuan Zhu, Fishkill, NY (US)

(73) Assignee: International Businsess Machines Corporation, Armonk, NY (US)

(*) Notice: Subject to any disclaimer, the term of this patent is extended or adjusted under 35 U.S.C. 154(b) by 0 days.

(21) Appl. No.: 13/617,904

(22) Filed: Sep. 14, 2012

Related U.S. Application Data

(62) Division of application No. 13/563,673, filed on Jul. 31, 2012.

(51) Int. Cl.
*H01L 23/52* (2006.01)

(52) U.S. Cl.
USPC ........... 257/209; 257/529; 257/E23.149; 977/734

(58) Field of Classification Search
USPC ........... 257/77, 209, 529, E23.147, E23.149; 438/132, 215, 281
See application file for complete search history.

(56) References Cited

U.S. PATENT DOCUMENTS

| | | | |
|---|---|---|---|
| 7,015,142 B2 | 3/2006 | DeHeer et al. | |
| 7,735,046 B2 | 6/2010 | Arsovski | |
| 7,781,862 B2 | 8/2010 | Bertin et al. | |
| 7,787,292 B2 | 8/2010 | Keshavarzi et al. | |
| 7,915,637 B2 | 3/2011 | Ghenciu et al. | |
| 8,167,190 B1* | 5/2012 | Bullock et al. | 228/119 |
| 2009/0174435 A1 | 7/2009 | Stan et al. | |
| 2010/0157651 A1 | 6/2010 | Kumar et al. | |
| 2010/0272978 A1* | 10/2010 | Kumar et al. | 428/220 |
| 2011/0108806 A1 | 5/2011 | Davidovic et al. | |
| 2011/0122672 A1* | 5/2011 | Kodama et al. | 365/96 |
| 2012/0181510 A1* | 7/2012 | Avouris et al. | 257/29 |
| 2012/0235118 A1* | 9/2012 | Avouris et al. | 257/27 |
| 2013/0011986 A1* | 1/2013 | Zhou et al. | 438/290 |

OTHER PUBLICATIONS

R. F. Rizzolo et al., "IBM System z9 eFUSE applications and methodology," IBM Journal of Research and Development, vol. 51, Issue 1-2, Jan. 2007, pp. 65-75.

Y. Awano. "Graphene for VLSI: FET and interconnect applications," 2009 IEEE International Electron Devices Meeting (IEDM), Dec. 7-9, 2009, 4 pages.

* cited by examiner

*Primary Examiner* — Jarrett Stark
*Assistant Examiner* — Shahed Ahmed
(74) *Attorney, Agent, or Firm* — Vazken Alexanian; McGinn IP Law Group, PLLC

(57) ABSTRACT

A semiconductor device includes a field-effect transistor (FET), and a fuse which includes a graphene layer and is electrically connected to the FET.

18 Claims, 6 Drawing Sheets

GRAPHENE-BASED EFUSE DEVICE

CROSS-REFERENCE TO RELATED APPLICATIONS

This application is a Continuation Application of U.S. patent application Ser. No. 13/563,673, having filing date of Jul. 31, 2012.

BACKGROUND OF THE INVENTION

1. Field of the Invention

The present invention relates generally to an efuse device and more particularly, to an efuse device which includes a graphene layer.

2. Description of the Related Art

In integrated circuits (e.g., complementary metal oxide semiconductor (CMOS) integrated circuits), it is often desirable to be able to permanently store information, or to form permanent connections of the integrated circuit after the circuit is manufactured. Fuses or devices forming fusible links are frequently used for this purpose.

Fuses can also be used to program redundant elements to replace identical defective elements (e.g., allowing for dynamic real-time reprogramming of a computer chip after the chip is fabricated). Further, fuses can be used to store die identification or other such information, or to adjust the speed of a circuit by adjusting the resistance of the current path.

An electrically programmable fuse (eFuse) device is a common fuse used in conventional integrated circuits. The eFuse device typically includes a silicide layer which is formed by silicidation of silicon. By flowing high current through the silicide layer, a large amount of heat is generated and causes a reflow of metal (such as nickel or cobalt), resulting in discontinuity of the silicide layer. That is, the silicide layer of the eFuse device is "blown".

A conventional eFuse may include a silicide layer on a silicon or polysilicon layer, which serves as a resistor (see, for example, Bohr et al. (U.S. Pat. No. 5,708,291) and Ito et al. (U.S. Pat. No. 6,580,156). In the initial state, the eFuse silicide is highly conductive, exhibiting low electrical resistance (the "unblown" state of the efuse). When a sufficiently large current is passed through the eFuse silicide, electro-migration starts to occur. This forms a gap in the silicide layer and greatly increases its electrical resistance. When the current source is removed, the silicide remains permanently in the diffused state, the "blown" state of the eFuse.

SUMMARY OF THE INVENTION

In view of the foregoing problems and drawbacks of the aforementioned conventional systems and methods, an exemplary aspect of the present invention is directed to a semiconductor device (e.g., an eFuse device) including a fuse which includes a graphene layer.

An exemplary aspect of the present invention is directed to a method of forming a semiconductor device which includes forming a field-effect transistor (FET), and forming a fuse which includes a graphene layer and is electrically connected to the FET.

Another exemplary aspect of the present invention is directed to a method of forming a semiconductor device which includes forming an isolation region in a substrate, forming a well region in the substrate, forming source and drain regions in the well region, forming a gate dielectric layer on the well region, forming a gate electrode on the gate dielectric, forming a graphene layer including a first end portion on the source region and a second end portion on a surface of the isolation region, forming an insulating film on the graphene layer, gate electrode, source region, drain region and isolation region, forming a fuse terminal on the first end portion of the graphene layer and on the source region, forming a source terminal on the second end portion of the graphene layer, and forming a drain terminal on the drain region.

Another exemplary aspect of the present invention is directed to a method of forming a semiconductor device including forming a well region in a substrate, forming source and drain regions in the well region, forming a gate dielectric layer on the well region, forming a gate electrode on the gate dielectric, forming a first insulating film on the gate electrode, source region and drain region, forming source and drain terminals in the first insulating film and contacting the source and drain regions, respectively, forming a graphene layer on the first insulating film and includes a first end portion which contacts the drain terminal and a second end portion which contacts the source terminal, forming a second insulating film on the graphene layer, forming a drain contact on the first end portion of the graphene layer and contacts the drain terminal, and forming a source contact on the second end portion of the graphene layer and contacts the source terminal.

Another exemplary aspect of the present invention is directed to a method of forming a semiconductor device including forming a field-effect transistor (FET), and forming a fuse which includes a graphene layer and is electrically connected to the FET, the forming of the fuse including one of forming the fuse in series with the FET, and forming the fuse in parallel with the FET.

With its unique and novel features, the present invention may provide a semiconductor device (e.g., an eFuse device) which is more effective and efficient than conventional devices.

BRIEF DESCRIPTION OF THE DRAWINGS

The foregoing and other exemplary aspects and advantages will be better understood from the following detailed description of the embodiments of the invention with reference to the drawings, in which.

DETAILED DESCRIPTION OF THE EXEMPLARY EMBODIMENTS OF THE INVENTION

Figure 1A:
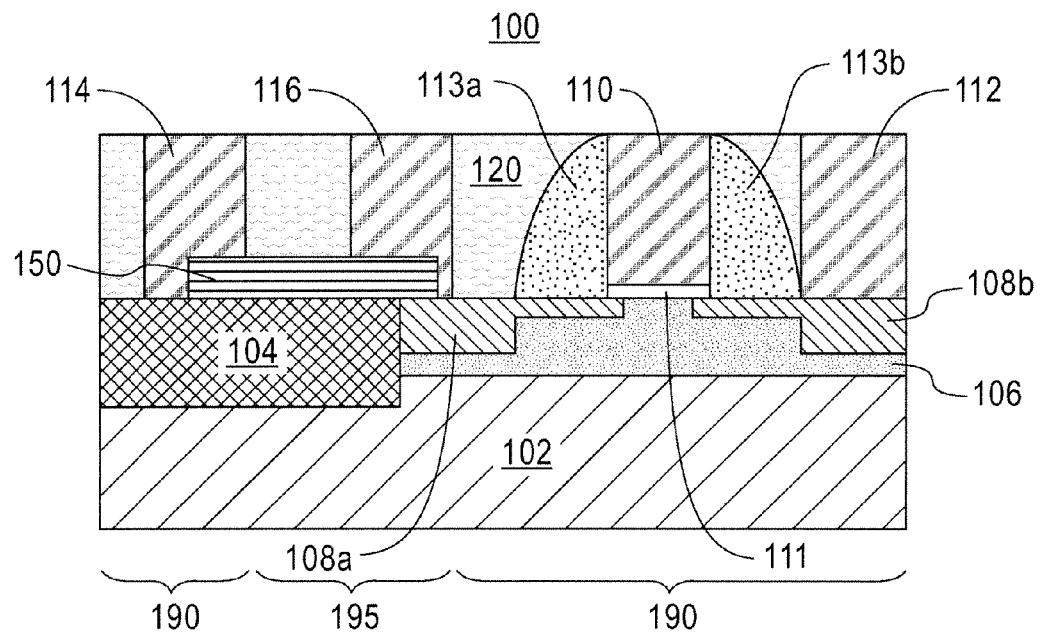
FIG. 1A illustrates a semiconductor device 100, according to an exemplary aspect of the present invention.

Referring now to the drawings, FIGS. 1A-5C illustrate some of the exemplary aspects of the present invention.

A problem with the conventional silicide-based eFuse is that the "blowing" process is very hard to control. If the current is too small, then there will be incomplete migration of the silicide. However, if the current is too high, then the overheating can generate a void and/or hillock (e.g., a bump) in the strip and surrounding structure, causing damage in the circuit.

To overcome these problems, the present invention provides a novel graphene-based efuse structure. Graphene is very electrically conductive, and in fact, has a conductivity which is similar to metal. Passing high current through graphene, may cause the graphene to burn away. Thus, graphene can serve as an electrical fuse.

FIG. 1A illustrates a semiconductor device 100, according to an exemplary aspect of the present invention.

As illustrated in FIG. 1A, the semiconductor device 100 includes a field-effect transistor (FET) 190 (e.g., a metal oxide field-effect transistor (MOSFET)), and fuse 195 which includes a graphene layer 150 (e.g., a plurality of graphene layers) and is electrically connected to the FET 190.

In particular, the fuse 195 (e.g., the graphene layer 150) may be formed in series with the FET 190 in this exemplary aspect of the present invention.

As illustrated in FIG. 1A, the semiconductor device 100 includes a substrate 102, an isolation region 104 (e.g., shallow trench isolation (STI) region) formed in the substrate 102, a well region 106, and source and drain regions 108a, 108b formed in the well region 106. The substrate can be silicon, SOI (silicon-on-insulator), silicon carbide, silicon germanium, germanium, a group II-VI compound, a group III-V material or combination of these materials.

The semiconductor device 100 also includes gate dielectric layer 111, a gate electrode 110 formed on gate dielectric layer 111, an insulating layer 120 formed on the isolation region 104 and the gate electrode 110, and a drain terminal 112 (e.g., drain electrode) formed in the insulating layer 120 and on the drain region 108b. The semiconductor device 100 may also include spacers 113a, 113b formed on the sidewall of the gate electrode 110 and gate dielectric layer 111, and on an extension region (e.g., lightly-doped portion) of the source and drain regions 108a, 108b.

The graphene layer 150 (e.g., a plurality of graphene layers) is formed on the isolation region 104 and on the source region 108a. A source terminal 114 (e.g., source electrode) is formed in the insulating layer 120 and on the isolation region 104 and contacts (e.g., is at least partially formed on) the graphene layer 150. A portion of the source terminal 114 may also be formed on the sidewall of the second end portion of the graphene layer 150.

The graphene layer 150 may, for example, be a patterned strip of graphene (e.g., a patterned strip of a plurality of layers of graphene). In addition, a fuse terminal 116 is formed in the insulating layer 120 and on the isolation region 104 and contacts (e.g., is at least partially formed on) the graphene layer 150. That is, a portion of the fuse terminal 116 may be formed on the sidewall of the first end portion of the graphene layer 150, and may also contact the source region 108a.

Alternatively, the fuse terminal 116 may be electrically connected to the graphene layer 150 and source region 108a by other configurations, such as (1) the fuse terminal 116 in contact with graphene layer 150 and graphene layer 150 in contact with the source region 108a, or (2) the fuse terminal 116 in contact with the source region 108a and the source region 108a in contact with graphene layer 150, or (3) the fuse terminal 116 in contact with both the graphene layer 150 and source region 108a while there is no direct contact between the graphene layer 150 and the source region 108a.

The source terminal 114, drain terminal 112 and fuse terminal 116 may include, for example, a conductive material such as polysilicon, or a metal such as titanium, palladium, gold, aluminum, copper, tungsten, etc.

That is, the fuse 195 of the semiconductor device 100 includes the graphene layer 150 and the fuse terminal 116 which is formed (e.g., at least partially) on the graphene layer 150.

In an exemplary aspect of the present invention, the length of the graphene strip may be in the range of 0.01 µm to 2 µm, the width of the graphene strip may be in the range of 0.1 µm to 20 µm, and the thickness of the graphene strip may be in the range of 1 to 10 atomic layers.

Assuming that the graphene layer 150 of the semiconductor device 100 has not been "blown", the semiconductor device 100 may behave like a field-effect transistor (FET), using the source terminal 114, drain terminal 112 and gate electrode 110.

The semiconductor device 100 may be "blown" by applying a high voltage between the source terminal 114 and the fuse terminal 116 (e.g., applying a high voltage to the source terminal 114) to introduce a high current on the graphene layer 150. The amount of the voltage required to "blow" the graphene layer 150 of the semiconductor device 100 may depend upon the dimensions of the graphene layer 150.

In particular, where the length of the graphene layer 150 is longer than 2 µm, a voltage of 5V or more is likely needed to "blow" the graphene layer 150 of the device 100. That is, introducing a high current may cause a gap in the graphene layer 150 to open the circuit between the source terminal 114 and the fuse terminal 116.

Thus, the dimensions of the graphene layer 150 should be sufficiently small in order to ensure that the semiconductor device 100 may be effectively "blown" by application of a voltage (e.g., about 5 V or less) to the graphene layer 150. Thus, for example, the length of the graphene layer 150 should be less than 2 µm for a programming voltage less than 5V.

Figure 1B:
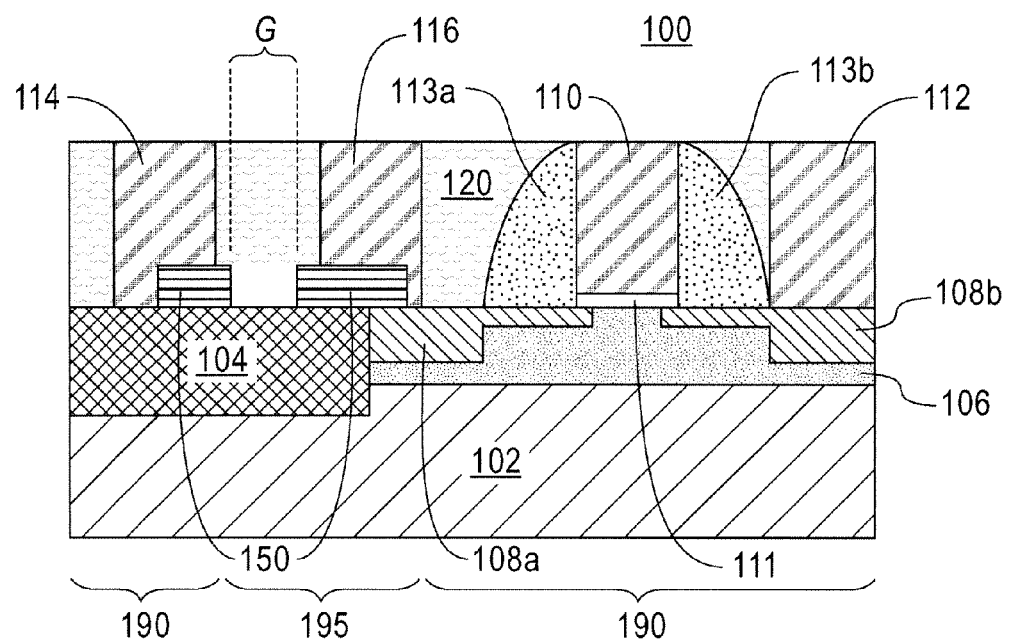
FIG. 1B illustrates the semiconductor device 100 after a high current has been introduced on the graphene layer 150 (e.g., after programming of the device 100), according to an exemplary aspect of the present invention.

FIG. 1B illustrates the semiconductor device 100 after the high current has been introduced on the graphene layer 150, according to an exemplary aspect of the present invention.

As illustrated in FIG. 1B, applying a high voltage to introduce a high current on the graphene layer 150 may destroy at least a portion of the graphene layer 150 (e.g., burn away the graphene layer 150) causing the gap "G" to form in the graphene layer 150, so that the source terminal 114 may be electrically disconnected from the fuse terminal 116. Thus, after the graphene layer 150 of the semiconductor device 100 is "blown" (e.g., at least of a portion of the graphene layer 150 is burned away), the semiconductor device 100 is open between the source terminal 114 and the fuse terminal 116.

Figure 2:
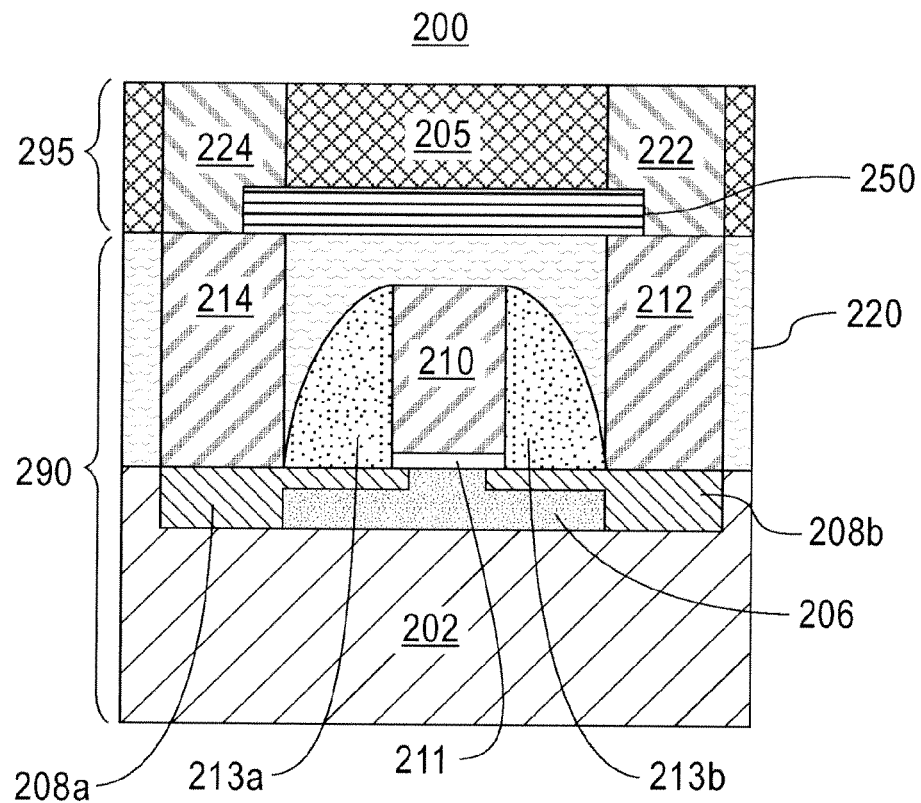
FIG. 2 illustrates a semiconductor device 200, according to another exemplary aspect of the present invention.

FIG. 2 illustrates a semiconductor device 200, according to another exemplary aspect of the present invention.

As illustrated in FIG. 2, the semiconductor device 200 includes a FET 290 (e.g., a metal oxide field-effect transistor (MOSFET)) and a fuse 295 which includes a graphene layer 250 (e.g., plurality of graphene layers) and is electrically connected to the FET 290.

In particular, the fuse 295 may be formed in parallel with a field-effect transistor (FET) 290 in this exemplary aspect of the present invention.

Further, the semiconductor device 200 may include a substrate 202, a well region 206 formed in the substrate 202, and source and drain regions 208a, 208b formed in the well region 206, a gate dielectric layer 211 formed on the well region 206, a gate electrode 210 formed on gate dielectric layer 211 and an insulating layer 220.

In addition, a drain terminal 212 (e.g., drain electrode) is formed in the insulating layer 220 on the drain region 208b, and a source terminal 214 (e.g., source electrode) formed in the insulating layer 220 on the source region 208a.

The semiconductor device 200 may also include spacers 213a, 213b formed on the sidewall of the gate electrode 210 and gate dielectric layer 211, and an extension region (e.g., lightly-doped portion) of the source and drain regions 208a, 208b.

A graphene layer 250 (e.g., a plurality of graphene layers) is formed on the insulating layer 220, and contacts the source terminal 214 and the drain terminal 212. That is, the graphene layer 250 may form a short circuit between the source terminal 214 and drain terminal 212. The graphene layer 250 may, for example, be a patterned strip of graphene (e.g., a patterned strip of a plurality of layers of graphene).

Further, a second insulation film 205 is formed on the insulating layer 220 and on the graphene layer 250, and a drain contact 222 is formed in the second insulation film 205 and contacts the drain terminal 212. Further, a source contact 224 is formed in the second insulation film 205 and contacts the source terminal 214.

That is, the fuse 295 of the semiconductor device 200 includes the graphene layer 250, and the drain and source contacts 222, 224 which are formed (e.g., at least partially) on the graphene layer 250.

In particular, in this exemplary aspect of the present invention, a first end portion of the graphene layer 250 is formed on the drain terminal 212, and a second end portion of the graphene layer 250 opposite the first end portion is formed on the source terminal 214. Thus, the drain contact 222 includes a first portion which is formed on the first end portion of the graphene layer 250, and a second portion which is formed on the drain terminal 212, and the source contact 224 includes a first portion which is formed on the second end portion of the graphene layer 250, and a second portion which is formed on the source terminal 214.

In this exemplary aspect, the characteristics of the graphene layer 250 (e.g., thickness, width etc.) may be similar to the characteristics of the graphene layer 150 discussed above with respect to the semiconductor device 100. The length of the graphene strip is in the range of 0.01 μm to 2 μm. The width of the graphene strip is in the range of 0.1 μm to 20 μm. The thickness of the graphene strip is in the range of 1 to 10 atomic layers.

Assuming that the graphene layer 250 of the semiconductor device 200 has not been blown, the semiconductor device 200 behaves like a conductor. That is, the FET 290 may be shorted by the graphene layer 250 (e.g., the graphene strip) in the fuse 295.

The graphene layer 250 of the semiconductor device 200 may be "blown" by applying a high voltage (e.g., a voltage of about 1.5 times $V_{dd}$ or greater) between the source terminal 214 and the drain terminal 212 to introduce a high current on the graphene layer 250, which destroys at least a portion of the graphene layer 250 (e.g., burns the graphene layer 250) causing the source terminal 214 to be electrically disconnected from the drain terminal 212 at a location above the insulating layer 220. That is, after the graphene layer 250 of the semiconductor device 200 is blown, the source terminal 214 and the drain terminal 212 are electrically connected only via the source and drain regions 208a, 208b, and the semiconductor device 200 behaves as a normal FET.

Thus, in summary, the semiconductor device 100 (e.g., FIG. 1A) includes a fuse 195 which is formed in series with the FET 190 and the fuse 195 includes a graphene layer 150 which is blown in order to deactivate the FET 190, and the semiconductor device 200 (e.g., FIG. 2) includes a fuse 295 which is formed in parallel with the FET 290 and the fuse 295 includes a graphene layer 250 which is blown in order to activate the FET 290.

Figure 3:
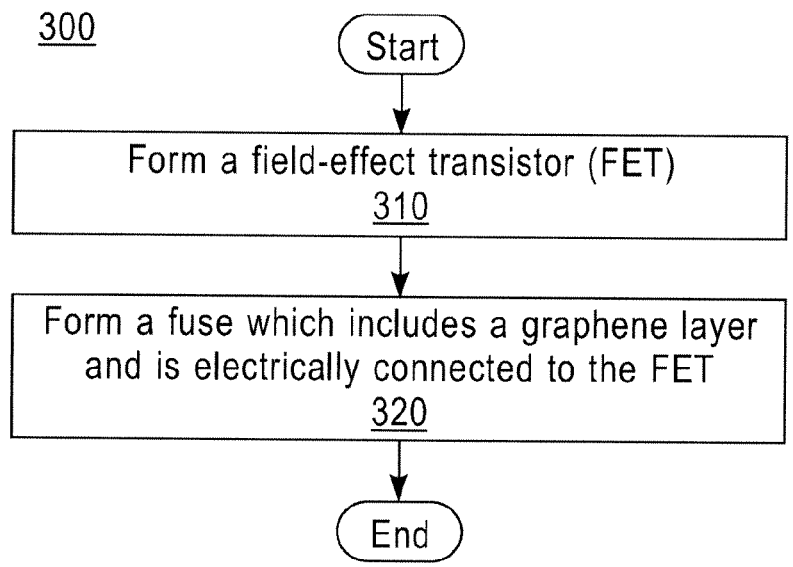
FIG. 3 illustrates a method 300 of manufacturing a semiconductor device (e.g., an eFuse device), according to an exemplary aspect of the present invention.

FIG. 3 illustrates a method 300 of manufacturing a semiconductor device (e.g., an eFuse device), according to an exemplary aspect of the present invention.

As illustrated in FIG. 3, the method 300 includes forming (310) a field-effect transistor (FET), and forming (320) a fuse which includes a graphene layer and is electrically connected to the FET. In particular, the forming (320) of the fuse may include forming a fuse which is in series with the FET (e.g., forming the fuse 150 in device 100 as illustrated in FIG. 1A), or forming a fuse which is in parallel with the FET (e.g., forming the fuse 250 in device 200 as illustrated in FIG. 2).

FIGS. 4A-4D illustrate a method of manufacturing a semiconductor device (e.g., device 100), according to another exemplary aspect of the present invention.

Figure 4A:
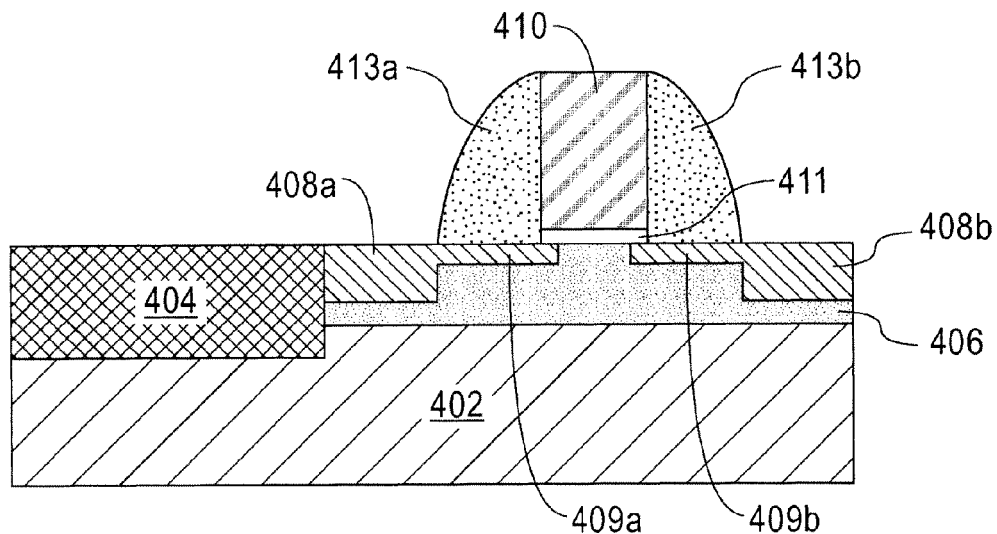
FIG. 4A illustrates forming of a field-effect transistor (FET) (e.g., a metal oxide semiconductor field-effect transistor (MOSFET)) using a complementary metal oxide semiconductor (CMOS) processing flow, according to an exemplary aspect of the present invention.

In particular, FIG. 4A illustrates forming of a field-effect transistor (FET) (e.g., a metal oxide semiconductor field-effect transistor (MOSFET)) using complementary metal oxide semiconductor (CMOS) processing flow up to forming of a silicide on the source and drain regions 408a, 408b. That is, FIG. 4A illustrates forming an isolation region 404 (e.g., shallow trench isolation (STI)) in a substrate 402, forming a well region 406 in the substrate 402, forming a gate dielectric layer 411 and a gate electrode 410, and implanting ions in the substrate 402 to form an extension regions 409a, 409b, forming spacers 413a, 413b on the sidewalls of the gate electrode 410 and the gate dielectric layer 411, and implanting ions in the well region 406 to form the source and drain regions 408a, 408b.

Figure 4B:
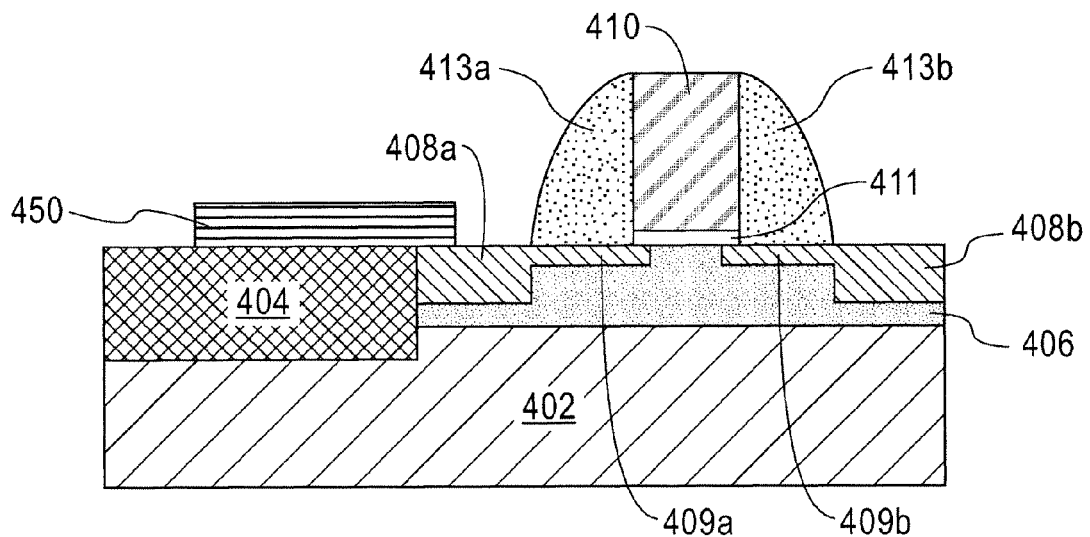
FIG. 4B illustrates forming (e.g., depositing) a graphene layer 450 (e.g., a plurality of graphene layers) on a surface (e.g., top surface) of the isolation region 404, and patterning the graphene layer 450, according to an exemplary aspect of the present invention.

FIG. 4B illustrates forming (e.g., depositing) a graphene layer 450 (e.g., a plurality of graphene layers) on a surface (e.g., top surface) of the isolation region 404, and patterning the graphene layer 450 by using lithography and oxygen plasma.

Figure 4C:
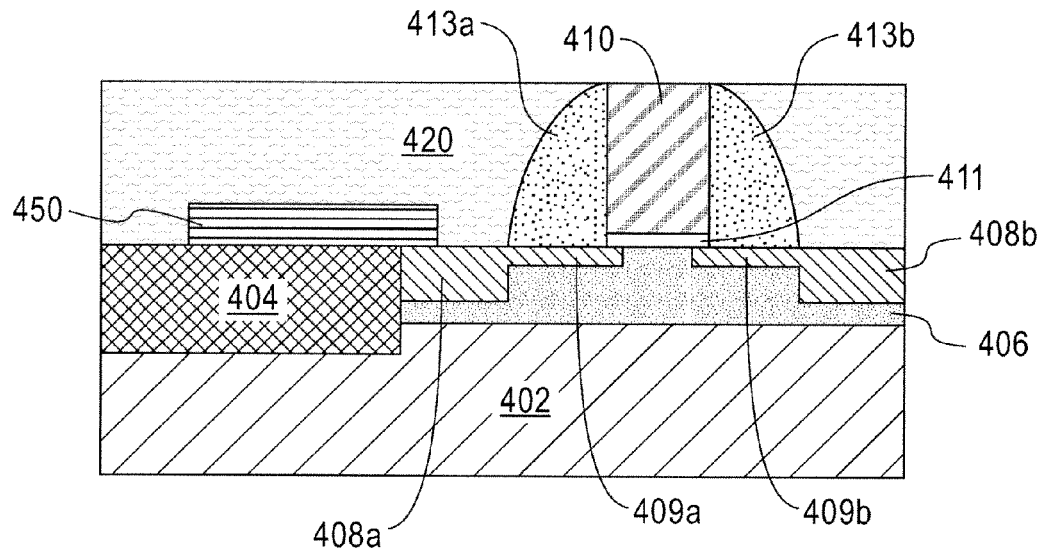
FIG. 4C illustrates forming an insulating layer 420 on the graphene layer 450 and planarizing the surface of the insulating layer 420 using, for example, chemical-mechanical polishing (CMP), according to an exemplary aspect of the present invention.

FIG. 4C illustrates forming an insulating layer 420 on the isolation region 404 and planarizing the surface of the insulating layer 420 using, for example, chemical-mechanical polishing (CMP).

Figure 4D:
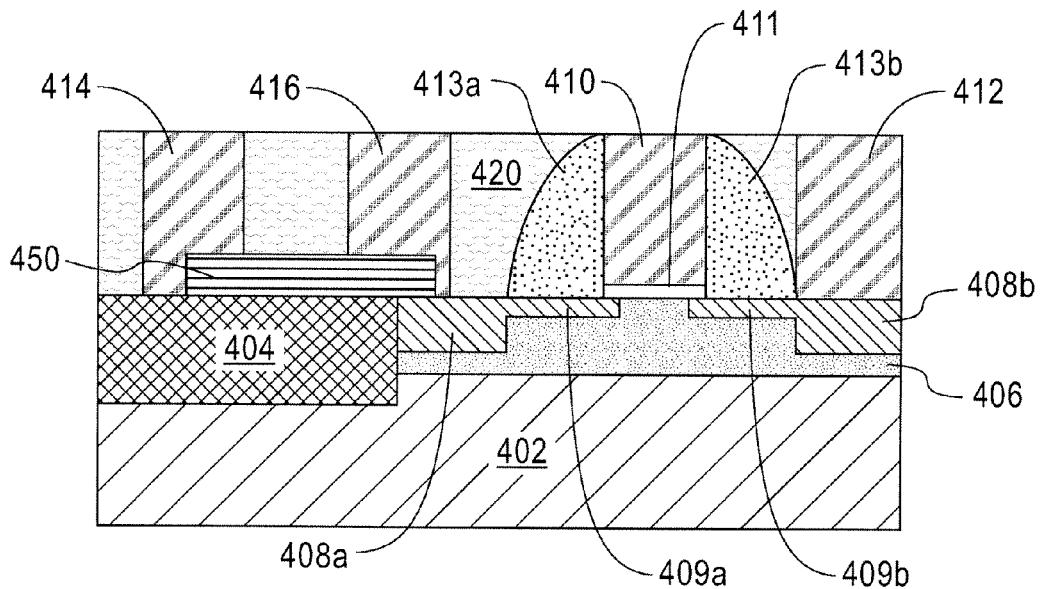
FIG. 4D illustrates forming a source terminal 414, fuse terminal 416 and drain terminal 412 in the insulating layer 420, according to an exemplary aspect of the present invention.

FIG. 4D illustrates forming a source terminal 414, fuse terminal 416 and drain terminal 412 in the insulating layer 420. Optionally, a silicide layer may be formed on a surface of the source and drain regions 408a, 408b in order to reduce a contact resistance between the source and drain regions 408a, 408b and the fuse and drain terminals 416, 412.

Figure 5A:
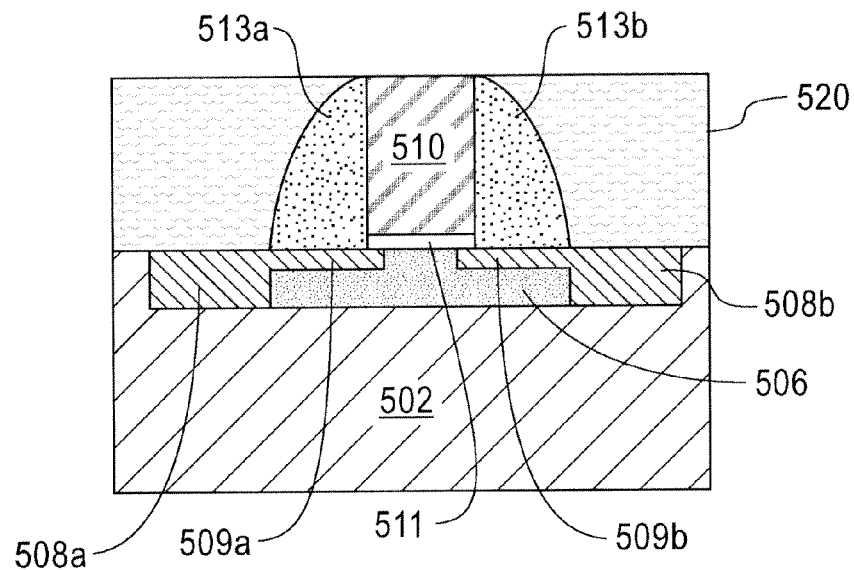
FIG. 5A illustrates forming a field-effect transistor (FET), according to an exemplary aspect of the present invention.
Figure 5B:
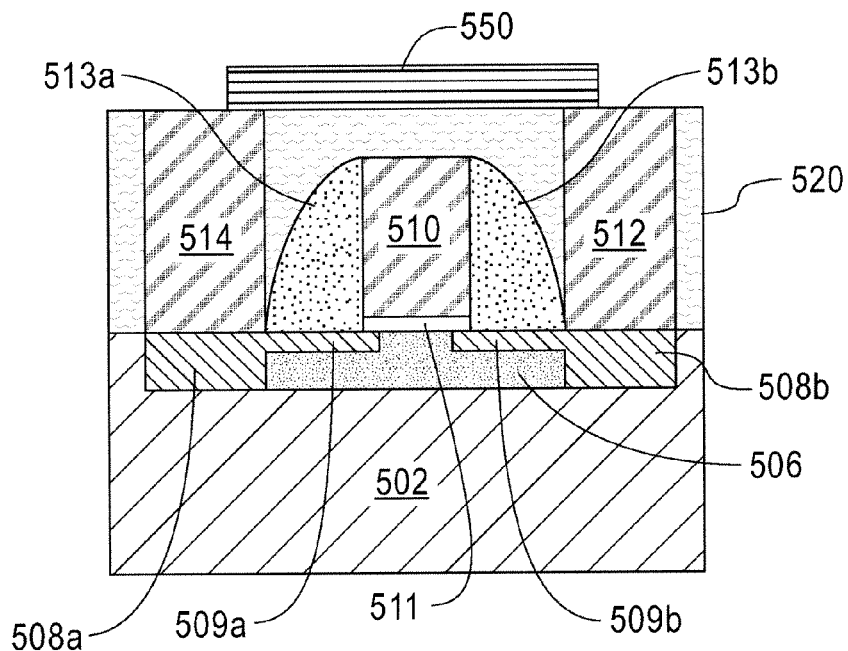
FIG. 5B illustrates depositing a graphene layer 550 (e.g., a plurality of graphene layers) on a surface (e.g., top surface) of the first insulating layer 520 (e.g., oxide layer), and patterning the graphene layer 550 by using lithography and oxygen plasma, according to an exemplary aspect of the present invention.
Figure 5C:
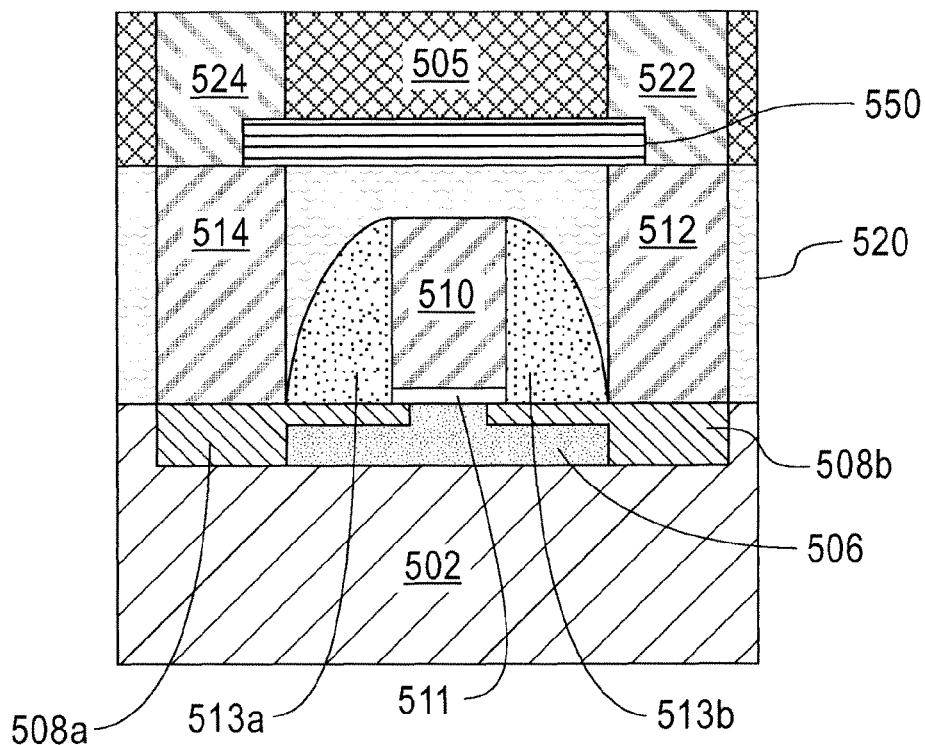
FIG. 5C illustrates forming a second insulating film 505 on the insulating layer, and forming source and drain contacts 524, 522 on the source and drain terminals 514, 512, respectively, and on the graphene layer 550, according to an exemplary aspect of the present invention.

FIGS. 5A-5C illustrate a method of manufacturing a semiconductor device (e.g., device 200), according to another exemplary aspect of the present invention.

In particular, FIG. 5A illustrates forming a field-effect transistor (FET) (e.g., forming a well region 506 in a substrate 502, forming a gate dielectric layer 511 and a gate electrode 510, implanting ions in the well region 506 to form an extension region 509a, 509b, forming spacers 513a, 513b on the sidewalls of the gate electrode 510 and the gate dielectric layer 511, and implanting ions in the well region 506 to form the source and drain regions 508a, 508b, and forming a first insulating layer 520 (e.g., oxide layer).

FIG. 5B illustrates forming the source terminal 514 and the drain terminal 512 in the first insulating layer 520 and on the source and drain regions 508a, 508b. Optionally, a silicide layer may be formed between the source and drain regions 508a 508b and the source and drain terminals 514, 512 in order to reduce a contact resistance therebetween.

FIG. 5B further illustrates depositing a graphene layer 550 (e.g., a plurality of graphene layers) on a surface (e.g., top surface) of the first insulating layer 520 (e.g., oxide layer), and patterning the graphene layer 550 by using lithography and oxygen plasma.

FIG. 5C illustrates forming an second insulating film 505 on the graphene layer 550 and insulating layer 520, and forming source and drain contacts 524, 522 on the source and drain terminals 514, 512, respectively, and on the graphene layer 550 (e.g., on the end portions of the graphene layer 550).

Another exemplary aspect of the present invention is directed to a circuit which includes the semiconductor device (e.g., device 100, device 200, etc.) according to the exemplary aspects of the present invention.

For example, a semiconductor device according to an exemplary aspect of the present invention (e.g., device 100, device 200 etc.) may be included in an integrated circuit (e.g., complementary metal oxide semiconductor (CMOS) integrated circuit) to permanently store information, to form permanent connections of the integrated circuit after the circuit is manufactured, to program redundant elements to replace identical defective elements (e.g., allowing for dynamic real-time reprogramming of a computer chip after the chip is fabricated), to store die identification or other such information, or to adjust the speed of a circuit by adjusting the resistance of the current path.

With its unique and novel features, the present invention may provide a semiconductor device (e.g., an eFuse device) which is more effective and efficient than conventional devices.

While the invention has been described in terms of one or more embodiments, those skilled in the art will recognize that the invention can be practiced with modification within the spirit and scope of the appended claims. Specifically, one of ordinary skill in the art will understand that the drawings herein are meant to be illustrative, and the design of the inventive device and method is not limited to that disclosed herein but may be modified within the spirit and scope of the present invention.

Further, Applicant's intent is to encompass the equivalents of all claim elements, and no amendment to any claim the present application should be construed as a disclaimer of any interest in or right to an equivalent of any element or feature of the amended claim.

What is claimed is:

1. A semiconductor device comprising:
    a field-effect transistor (FET) comprising:
        source and drain regions formed in a substrate;
        source and drain terminals formed on the source and drain regions, respectively; and
        a channel region formed between the source and drain regions; and
    a fuse which includes a graphene layer which is electrically connected to the source terminal of the FET.

2. The semiconductor device of claim 1, wherein the fuse is formed in series with the FET.

3. The semiconductor device of claim 2, wherein the fuse further comprises a fuse terminal formed on an end portion of the graphene layer.

4. The semiconductor device of claim 2, wherein the FET further comprises:
    an isolation region formed in the substrate;
    a well region formed in the substrate, the source and drain regions being formed in the well region;
    a gate dielectric layer formed on the well region; and
    a gate electrode formed on the gate dielectric layer.

5. The semiconductor device of claim 4, wherein the FET further comprises:
    a silicide layer formed on the source and drain regions;
    a pair of spacers formed on a side of the gate electrode and the gate dielectric layer; and
    a pair of extension regions formed in the well region and adjacent to the source and drain regions.

6. The semiconductor device of claim 4, wherein the substrate comprises at least one member selected from the group consisting of silicon, silicon-on-insulator (SOI), silicon carbide, silicon germanium, germanium, a group II-VI compound and a group III-V material.

7. The semiconductor device of claim 4, wherein the graphene layer is formed on a surface of the isolation region and the source region.

8. The semiconductor device of claim 4, wherein the FET further comprises:
    an insulating film formed on the graphene layer, gate electrode, source region, drain region and isolation region,
    wherein the drain terminal is formed in the insulating film and contacts the drain region; and
    wherein the source terminal is formed on an end portion of the graphene layer.

9. The semiconductor device of claim 8, wherein at least a portion of the graphene layer is destructible by a high voltage applied to the graphene layer to open the FET between the source terminal and the drain terminal.

10. The semiconductor device of claim 1, wherein the fuse is formed in parallel with the FET.

11. The semiconductor device of claim 10, wherein the FET further comprises:
    a well region formed in the substrate, the source and drain regions being formed in the well region;
    a gate dielectric layer formed on the well region;
    a gate electrode formed on the gate dielectric layer; and
    a first insulating film formed on the gate electrode, source region and drain region,
    wherein the source and drain terminals are formed in the first insulating film and contact the source and drain regions, respectively.

12. The semiconductor device of claim 10, wherein the fuse further comprises:
   an insulating film formed on the graphene layer;
   a drain contact formed in the insulating film and contacting a first end portion of the graphene layer; and
   a source contact formed in the insulating film and contacting a second end portion of the graphene layer.

13. The semiconductor device of claim 12, wherein the source and drain terminals contact the source and drain regions, respectively, and
   wherein the first end portion of the graphene layer contacts the drain terminal of the FET and the second end portion of the graphene layer contacts the source terminal of the FET.

14. The semiconductor device of claim 10, wherein at least a portion of the graphene layer is destructible by a high voltage applied to the graphene layer to eliminate a shorting of the FET by the graphene layer.

15. The semiconductor device of claim 1, wherein the graphene layer has a length in a range from 0.01 μm to 2 μm, a width in a range from 0.1 μm to 20 μm and a thickness in a range from 1 atomic layer to 10 atomic layers.

16. A semiconductor device comprising:
   a substrate;
   an isolation region formed in the substrate;
   a well region formed in the substrate;
   source and drain regions formed in the well region;
   a gate dielectric layer formed on the well region;
   a gate electrode formed on the gate dielectric;
   a graphene layer comprising a first end portion which is formed on the source region and a second end portion which is formed on a surface of the isolation region;
   an insulating film formed on the graphene layer, gate electrode, source region, drain region and isolation region;
   a fuse terminal which is formed on the first end portion of the graphene layer and on the source region;
   a source terminal formed on the second end portion of the graphene layer; and
   a drain terminal formed on the drain region.

17. The semiconductor device of claim 16, wherein the source terminal, drain terminal, gate electrode and fuse terminal comprise at least one member selected from the group consisting of polysilicon, titanium, palladium, gold, aluminum, copper and tungsten.

18. A semiconductor device comprising:
   a substrate;
   a well region formed in the substrate;
   source and drain regions formed in the well region;
   a gate dielectric layer formed on the well region;
   a gate electrode formed on the gate dielectric;
   a first insulating film formed on the gate electrode, source region and drain region;
   source and drain terminals formed in the first insulating film and contacting the source and drain regions, respectively;
   a graphene layer which is formed on the first insulating film and includes a first end portion which contacts the drain terminal and a second end portion which contacts the source terminal;
   a second insulating film formed on the graphene layer;
   a drain contact which is formed on the first end portion of the graphene layer and contacts the drain terminal; and
   a source contact which is formed on the second end portion of the graphene layer and contacts the source terminal.

* * * * *